United States Patent
Habitz et al.

(10) Patent No.: US 7,266,474 B2
(45) Date of Patent: Sep. 4, 2007

(54) RING OSCILLATOR STRUCTURE AND METHOD OF SEPARATING RANDOM AND SYSTEMATIC TOLERANCE VALUES

(75) Inventors: Peter A. Habitz, Hinesburg, VT (US); Jerry D. Hayes, Milton, VT (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 11/162,197

(22) Filed: Aug. 31, 2005

(65) Prior Publication Data

US 2007/0050164 A1     Mar. 1, 2007

(51) Int. Cl.
G06F 11/30 (2006.01)
H03K 3/03 (2006.01)
G01R 23/00 (2006.01)

(52) U.S. Cl. .................. 702/182; 331/57; 331/44
(58) Field of Classification Search .............. 702/182
See application file for complete search history.

(56) References Cited

U.S. PATENT DOCUMENTS

| | | | |
|---|---|---|---|
| 4,280,855 A | 7/1981 | Bertin | |
| 5,365,463 A | 11/1994 | Donath | |
| 5,418,931 A | 5/1995 | Moorby | |
| 5,655,110 A | 8/1997 | Krivokapic | |
| 6,018,623 A | 1/2000 | Chang | |
| 6,219,305 B1 | 4/2001 | Patrie | |
| 6,219,631 B1 | 4/2001 | Oh | |
| 6,232,845 B1 | 5/2001 | Kingsley | |
| 6,294,397 B1 | 9/2001 | Jarvis | |
| 6,310,928 B1 * | 10/2001 | Yunome | 375/376 |
| 6,465,265 B2 | 10/2002 | Opsal | |
| 6,544,807 B1 | 4/2003 | Bach | |
| 6,735,543 B2 | 5/2004 | Douskey | |
| 6,774,734 B2 | 8/2004 | Christensen | |
| 6,836,164 B1 * | 12/2004 | Wang et al. | 327/156 |
| 2004/0263265 A1 * | 12/2004 | Allen et al. | 331/57 |

* cited by examiner

Primary Examiner—John Barlow
Assistant Examiner—Lisa Sievers
(74) Attorney, Agent, or Firm—W. Riyon Harding

(57) ABSTRACT

A ring oscillator test structure comprises at least two overlapping rings that are switchable between different numbers of stages. A delay distribution is measured for various numbers of stages in a set of oscillators formed in different locations subject to different systematic delay effects. The delay distributions are analyzed to isolate the systematic and the random contributions to the standard deviation of the distributions.

10 Claims, 2 Drawing Sheets

RING OSCILLATOR STRUCTURE AND METHOD OF SEPARATING RANDOM AND SYSTEMATIC TOLERANCE VALUES

TECHNICAL FIELD

The field of the invention is that of integrated circuit design and processing, in particular predicting the time dependence of signals within an integrated circuit.

BACKGROUND OF THE INVENTION

In the field of integrated circuit processing, and the sub-field of statistical analysis and circuit yield, it is continually more important to accurately measure and understand the statistical variation of devices and interconnections. Variations in these quantities occur as a result of the IC manufacturing process—variations in the composition of the materials that make up the devices and in the dimensions of the devices. An important component of this understanding is the relative influence of systematic and random contributions to the net variation.

It is well known that there is variation across an integrated circuit chip of the composition of the materials used to form the IC and also the dimensions of devices and connections. For example, CVD deposition is not uniform across a chip and less uniform across a wafer, in spite of determined efforts by process engineers to achieve perfect uniformity. As another example, the lithography process does not produce geometric figures (lines, rectangles, etc.) that are perfectly uniform across a chip or wafer.

As a result, transistors and other devices are not uniform across a chip and their switching speed, transit time, switching voltage and other parameters will not be uniform. Further, the performance of devices, sub-circuits etc. will not be uniform even when the systematic variation has been reduced as much as possible, and there will be random statistical fluctuations in operating parameters.

These random fluctuations can be caused by the stochastical distribution of dopants varying the amount of impurities within the channel of semiconductors transistors, the roughness of the injecting edges in the transistor junction causing very local channel length variations and the topography of the thickness variation of the gate oxide.

In the course of designing a circuit, it is necessary to calculate the time at which signals arrive, e.g. all the inputs to an AND circuit must arrive at the same time (within a margin of error). It is also important to calculate possible failures caused by systematic errors in the thickness of a film layer or in the amount of dopant in a component.

A simple approach in the past has been to make pessimistic assumptions, similar to a worst-case scenario. As technology improves and the demands of space limitations become more stringent, this approach becomes less tenable and it is more important that the estimates be accurate.

The variation of a parameter will depend on both systematic variations that depend on non-uniform concentration of dopant, film thickness and the like and random statistical fluctuations. The random variations will tend to cancel out when a number of steps are performed in a calculation to get a result.

Thus, simply adding up variations will produce a pessimistic result that is wasteful in that a greater timing margin (or other margin in film thickness and the like) is used in the design than is necessary. A more accurate result that exploits resources more efficiently can be achieved if the random and system sources of variation are well known.

The art could benefit from a test structure and method to improve the accuracy of estimates of random and systematic errors in integrated circuit parameters.

SUMMARY OF THE INVENTION

The invention relates to a test structure and method for estimating systematic and random variations separately in the parameters of integrated circuit elements.

A feature of the invention is a test structure that is a ring oscillator that controllably operates in two or more modes varying the numbers of stages in the ring.

Another feature of the invention is that fitting the observed data delay in the structure to parameters for systematic and random variation produces improved more accurate values for systematic and random variation.

DETAILED DESCRIPTION

Test structures used today for characterizing circuit performance as a function of process variation typically consist of fixed length ring oscillators made up of identical cells placed at various locations within the die. The oscillation period of any given fixed length ring oscillator can then be used to estimate process variation when compared to other structurally equivalent ring oscillators across the die or wafer.

The difference in ring oscillator performance can be attributed to either systematic variation, random variation, or a combination of both systematic and random variation in the process. Depending upon the length or number of cells within the ring oscillator, the sensitivity to systematic variation as compared to the sensitivity to random variation will vary greatly.

For long ring oscillators, i.e. oscillators with many cells, ring performance is determined primarily by systematic process variations while for short rings random process variations can become more important although sensitivity to systematic variation still plays a role.

One solution for isolating systematic variations from random variations would be to have test structures of various lengths where each length maximizes sensitivity to one of the variations. One choice is to use a long ring oscillator to isolate systematic process variations. When compared to other equivalent ring oscillators at different locations, the systematic process variation can be determined from performance differences of long ring oscillators since sensitivity to random process variations is small in each of these type rings.

To isolate random variations one may be tempted to compare equivalent short ring oscillators at different die locations. However the sensitivity to systematic variations can still be significant making it difficult if not impossible to separate the random and systematic process variations.

Figure 1:
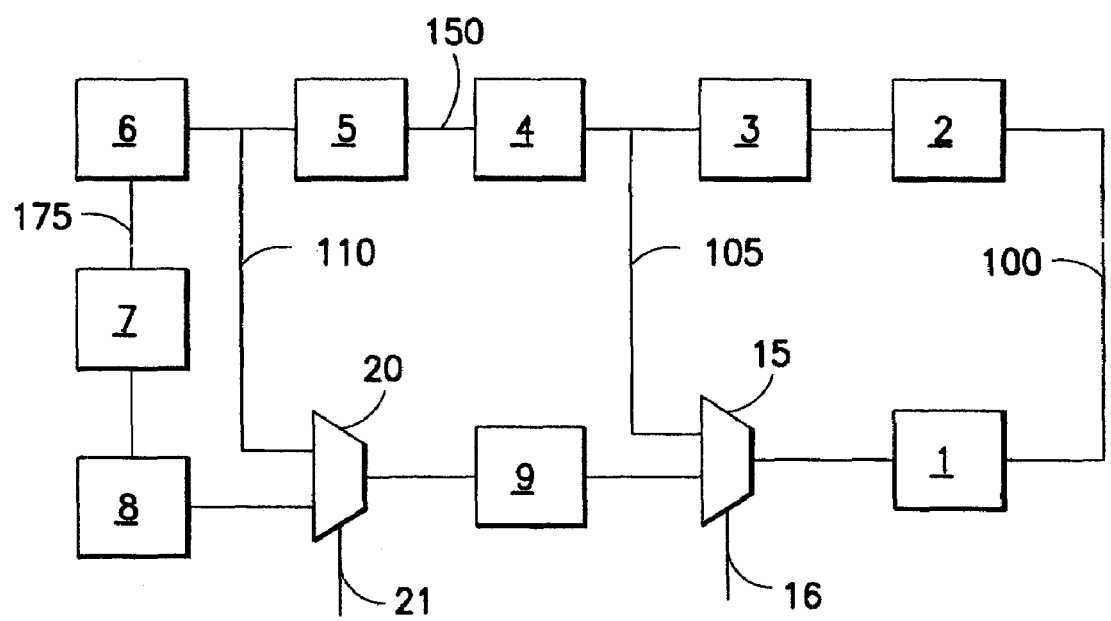
FIG. 1 shows a diagram of a test structure according to the invention.

In order to isolate random variations for process characterization, one needs to remove the effects of systematic variation from the analysis. FIG. 1 illustrates a set of controllable length ring oscillators for isolating random and systematic process variations.

The example test structure in FIG. 1 shows a controllable-length ring oscillator comprising a set of stages 1, 2, 3 - - - 9 arranged in three loops 100, 150 and 175 and connected by multiplexers 15 and 20.

The smallest loop 100 has three stages 1, 2 and 3 and is closed by path 105, passing through multiplexer 15. The control of multiplexer 15 is that when line 16 is high, loop 100 is closed, forming a three-stage loop.

The next loop comprises stages 1-3 plus 4, 5 and 9, with path 110 closing loop 150 through multiplexer 20. When line 21 is high, and line 16 is low, the path around loop 150 is 1-3, 4, 5 and 9.

The last loop 175 comprises all nine stages 1-9, with lines 16 and 21 low.

Illustratively, units 1-9 are inverters and lines 16 and 21 are connected to external pins, so that the configuration of each loop can be set externally, e.g. in a tester system. As an example, there may be 100 such test structures on a chip, and various chips on a wafer may have the test structures.

The delay for a signal to pass through a sub-circuit (cell) will have a nominal value and will have variations with respect to that value, the variations having a typical distribution reasonably close to a normal distribution. Typically, there will be variations within a chip and the mean value of a distribution will vary from chip to chip in a wafer, a process lot of wafers and/or the entire production run within a given technology. The variation within a chip can be systematic (ex: a localized variation in quantity of material deposited) depending on: the position on the chip; the density and direction of shapes; or on other physical interactions.

Figure 2:
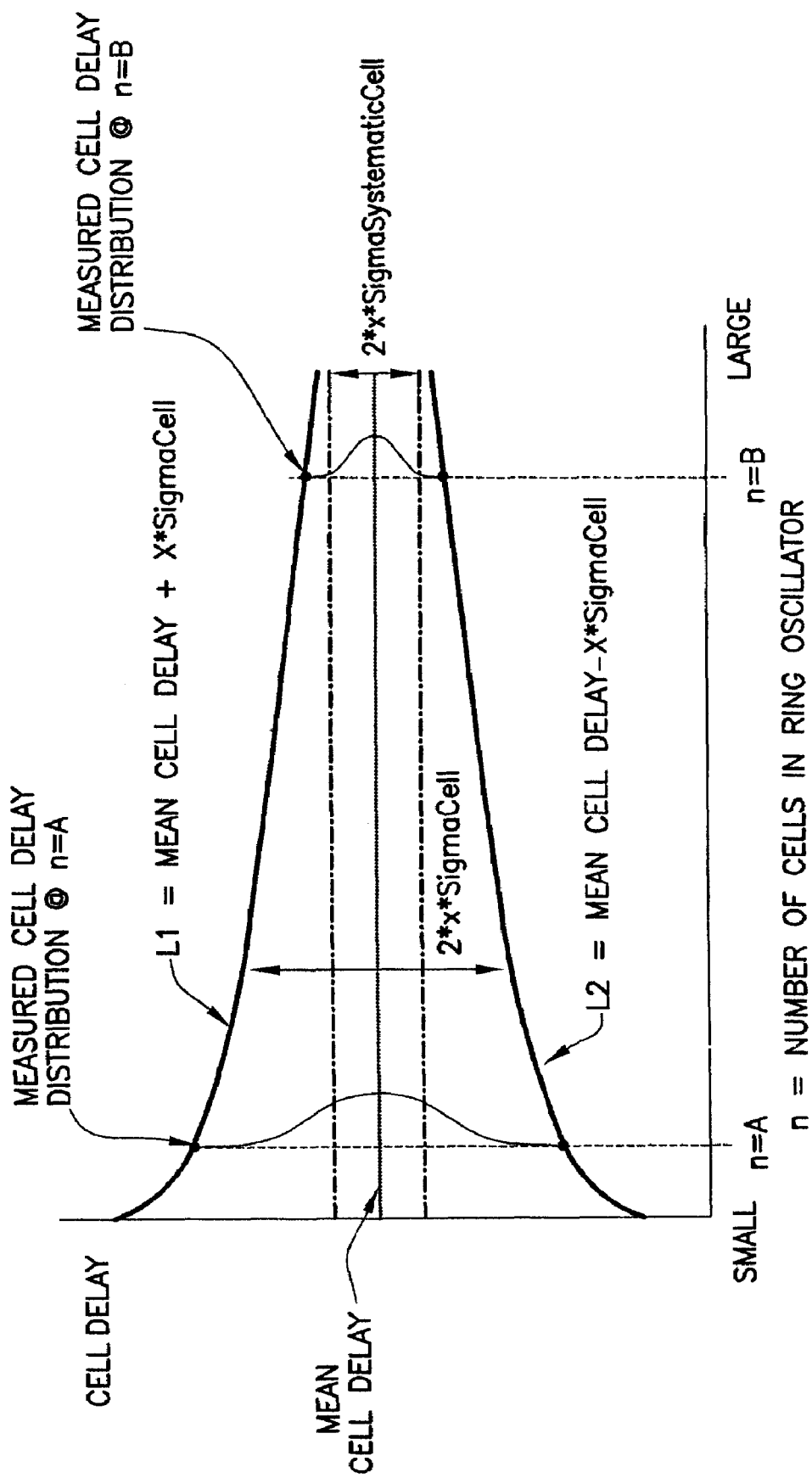
FIG. 2 shows cell delay distributions as a function of the number of cells within a test structure.

In addition, a perfectly random distribution can also exist. This variation has the advantage that the effect cancels out with frequent usage of the cell; i.e. the result of a chain of e.g. 100 logic elements will have less variation per cell than a chain of 10 elements as illustrated in FIG. 2.

This figure illustrates normalized cell delay distributions of controllable-length ring oscillators where length is defined by the number of active cells within the ring oscillator. For a given length, denoted by "n" in FIG. 2, a cell delay distribution is obtained by measuring delays of multiple ring oscillators with identical structures and length across many die locations, wafers, and manufacturing lots in order to achieve statistical relevance. Each delay is then normalized by dividing by n, thereby obtaining an average cell delay for each ring oscillator. This process is then repeated for each "n" value of the controllable-length of the ring oscillators.

One of the salient features of a controllable-length ring oscillator is that the sensitivity due to systematic process variations is relatively constant across each cell within ring due to their close proximity. This allows the standard deviation of ring oscillator performance due to systematic variations, SigmaSystematicRing, to be expressed as a function of number of cells (n) times the standard deviation of cell delay due to systematic variations, SigmaSystematicCell, as given in equation 1.

$$\text{SigmaSystematicRing} = n * \text{SigmaSystematicCell} \qquad \text{EQ-1}$$

The standard deviation of ring oscillator performance due to random variations, SigmaRandomRing, can be related to the standard deviation of cell delay due to random variations, SigmaRandomCell, and the number of cells using equation 2.

$$\text{SigmaRandomRing} = SQRT(n * \text{SigmaRandomCell}^2) \qquad \text{EQ-2}$$

The overall standard deviation for ring oscillator performance, SigmaRing, can now be expressed as a function of both SigmaSystematicRing and SigmaRandomRing as shown in equation 3.

$$\text{SigmaRing} = SQRT(\text{SigmaSystematicRing}^2 + \text{SigmaRandomRing}^2) \qquad \text{EQ-3}$$

Substituting equations 1 and 2 into equation 3 gives, $$\text{SigmaRing} = n * SQRT(\text{SigmaSystematicCell}^2 + \text{SigmaRandomCell}^2/n) \qquad \text{EQ-4}$$

The standard deviation for cell delay performance, SigmaCell, is related to SigmaRing as, $$\text{SigmaCell} = \text{SigmaRing}/n = SQRT(\text{SigmaSystematicCell}^2 + \text{SigmaRandomCell}^2/n) \qquad \text{EQ-5}$$

SigmaCell can be used to describe the measured chip delay distributions as a function of n. Two measured cell delay distributions corresponding to n=A and n=B are illustrated in FIG. 2. The widths of each measured distribution are related to each other by lines L1 and L2 given as $$L1 = \text{Mean Cell Delay} + X * \text{SigmaCell}$$

$$L2 = \text{Mean Cell Delay} - X * \text{SigmaCell}$$

The value for X is typically chosen to be 3, representing +/-3 sigma variation of average cell delay. The measured vertical distance, i.e. width of a distribution, between lines L1 and L2 can be used to calculate SigmaCell as a function of n.

$$(\text{SigmaCell} @ n=\text{value}) = (\text{Measured Distribution} @ n=\text{value})/(2*X) \qquad \text{EQ-6}$$

The dotted horizontal line in the center of the FIG. 2 is the mean cell delay and the horizontal dashed lines represent the Mean Cell Delay+/-SigmaSystematicCell.

The measured chip delay distributions can be used to determine SigmaSystematicCell and SigmaRandomCell. When n is large, e.g. n=B in FIG. 2, the variation of average cell delay converges to the systematic distribution thus eliminating the random affects, resulting in SigmaSystemCell equaling SigmaCell where SigmaCell is calculated from equation 6. In practice, the systematic variations can be ignored for relatively small values of n, e.g. n=60, making it feasible to design controllable-length ring oscillators where systematic variations can be separated from random variations at the maximum length of the ring oscillator.

SigmaRandomCell can be found using the SigmaCell calculated at n=small, e.g. n=A, using equation 6 and the SigmaSystematicCell calculated at n=large (n=B). as shown in equation 7. Point A is selected by choosing n=small such that the sensitivity to random variations is significant. To verify the choice of "n" corresponding to point A, compare the width of the cell delay distribution at point A with the cell delay distribution at n=large. The greater the difference between the width of these distributions, the greater the sensitivity cell delay at point A has to random variations since it is assumed the cell delay distributions at n=large is only a function of systematic sensitivity.

$$\text{SigmaRandomCell} = SQRT(n*(\text{SigmaCell}@n=A^2 - \text{SigmaSystematicCell}@n=B^2)) \qquad \text{EQ-7}$$

A useful comparison with previous test structures is that other workers have constructed multiple discrete ring oscillators of different lengths located necessarily at different places on a chip. The result is that calculations made on that basis have a systematic offset (e.g. due to systematic placement dependent change in the delay of each stage) that is difficult or impossible to calibrate out between different oscillator structures; i.e. the systematic parts of the variation are not additive.

While the invention has been described in terms of a single preferred embodiment, those skilled in the art will recognize that the invention can be practiced in various versions within the spirit and scope of the following claims.

What is claimed is:

1. A method of characterizing random and systematic variations in a semiconductor manufacturing process, comprising:
   providing a set of variable delay ring oscillator test circuits having a ring delay with a plurality of stages and a ring delay distribution width;
   measuring the ring delay for a set of ring oscillator test circuits in multiple placements of said process:
   measuring a delay distribution of a ring oscillator with at least two different numbers n of delay stages in a path of a recalculating loop;
   measuring the width of the delay distribution of said ring oscillator with n stages;
   identifying and separating the contributions of random variations SigmaRandomRing and systematic variations SigmaSystematicRing in the delay distribution;
   calculating a statistical distribution of random and systematic variations per cell in manufacturing processes; and
   storing the statistical distribution of random and systematic variations in a memory.

2. A method according to claim 1, further comprising a step of fitting SigmaRandomRing and SigmaSystematicRing as a function of delay stage number n.

3. A method according to claim 2, further comprising a step of calculating per stage tolerance contributions SigmaRandomCell and SigmaSystematicCell of random variations SigmaRandomRing and systematic variations SigmaSystematicRing in the delay distribution.

4. A method according to claim 3, in which said set of ring oscillator test circuits are distributed across at least two integrated circuits on a wafer.

5. A method according to claim 2, in which said set of ring oscillator test circuits are distributed across at least two integrated circuits on a wafer.

6. A method according to claim 1, further comprising a step of calculating per stage contributions SigmaRandomCell and SigmaSystematicCell of random variations SigmaRandomRing and systematic variations SigmaSystematicRing in the delay distribution.

7. A method according to claim 6, in which said set of ring oscillator test circuits are distributed across at least two integrated circuits on a wafer.

8. A method according to claim 1, in which said set of ring oscillator test circuits are distributed across at least two integrated circuits on a wafer.

9. A method according to claim 1, in which said ring oscillator test circuits comprise at least two overlapping ring oscillators.

10. A method according to claim 9, in which said at least two overlapping ring oscillators have a first loop in common and controllable means for connecting a second loop to said first loop and for disabling a portion of said first loop.

* * * * *